United States Patent [19]

Behn

[11] 4,378,382

[45] Mar. 29, 1983

[54] METHOD AND APPARATUS FOR PRODUCING LAMINATED CAPACITORS

[75] Inventor: Reinhard Behn, Munich, Fed. Rep. of Germany

[73] Assignee: Siemens Aktiengesellschaft, Berlin and Munich, Fed. Rep. of Germany

[21] Appl. No.: 283,821

[22] Filed: Jul. 16, 1981

[30] Foreign Application Priority Data

Jul. 24, 1980 [DE] Fed. Rep. of Germany ....... 3028123

[51] Int. Cl.$^3$ .............................................. B05C 11/00
[52] U.S. Cl. ......................................... 427/9; 427/81;
427/251; 427/255.5; 427/255.6; 427/255.7;
427/404; 427/407.1; 118/664; 118/697;
118/719; 118/720; 118/721; 118/730
[58] Field of Search ...................... 427/81, 251, 255.5,
427/255.6, 255.7, 404, 407.1, 9, 10; 118/719,
720, 721, 730, 664, 697

[56] References Cited

U.S. PATENT DOCUMENTS 4,121,537 10/1978 Maruyama et al. ................. 118/730
4,207,836 6/1980 Nonaka .............................. 118/730

FOREIGN PATENT DOCUMENTS 2847620 2/1978 Fed. Rep. of Germany .
2036087 11/1979 United Kingdom .

*Primary Examiner*—Norman Morgenstern
*Assistant Examiner*—Richard Bueker
*Attorney, Agent, or Firm*—Herbert L. Lerner; Laurence A. Greenberg

[57] ABSTRACT

Method for producing laminated capacitors, including a rotatable drum having a periphery and recesses formed therein, carriers disposed on the drum in the recesses defining a setting range on the periphery of the drum, a first vacuum chamber for metal layer deposition, a second vacuum chamber for insulating material layer deposition, means for supplying a vapor jet through a path in the first vacuum chamber and a shielding mask for shielding the carriers from the vapor jet, which includes shielding off the carriers from the vapor jet with the shielding mask before vapor deposition, alternatingly conducting the carriers on the drum through the first and second vacuum chambers, removing the shielding mask from the vapor jet path after a given number of revolutions of the drum for the period during which the setting range on the periphery of drum rotates through the first zone, and reintroducing the shielding mask in the vapor jet path after the last metal layer has been deposited during the rotation through the setting range, and a device for carrying out the method.

6 Claims, 1 Drawing Figure

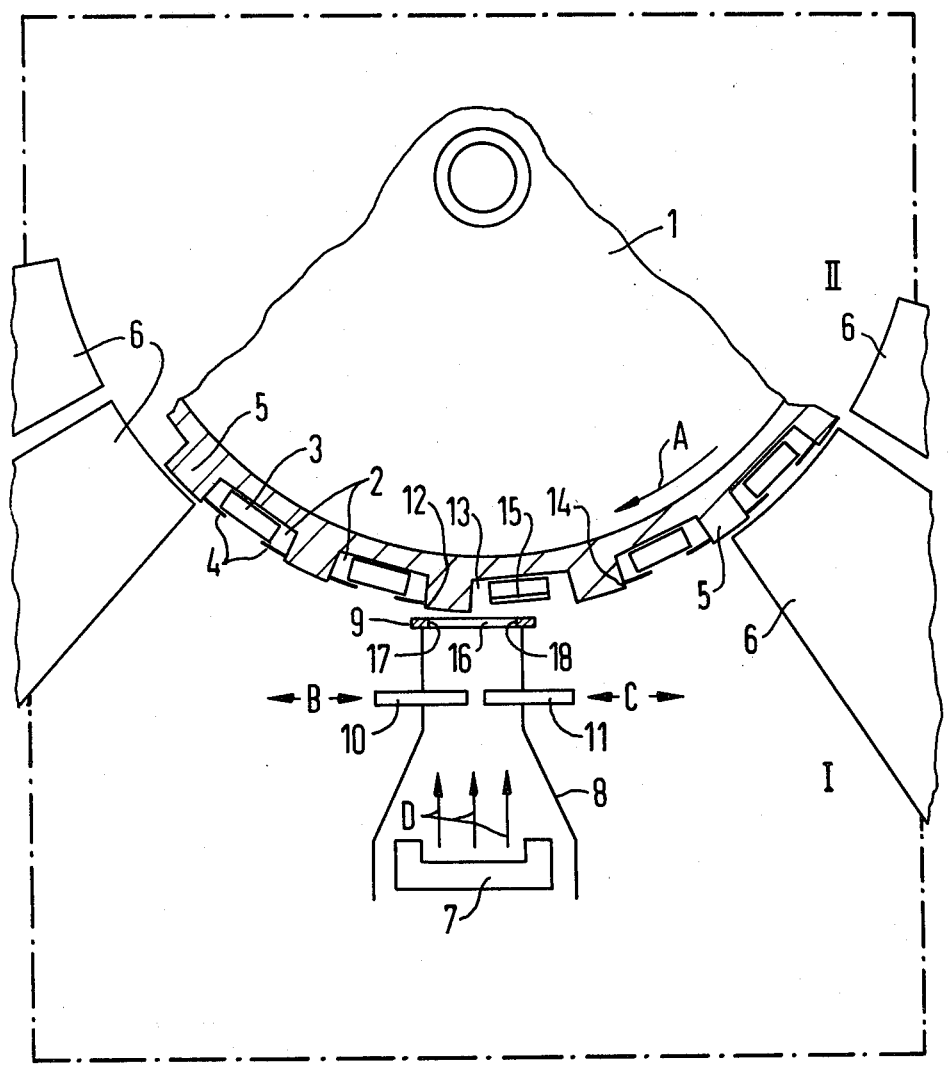

METHOD AND APPARATUS FOR PRODUCING LAMINATED CAPACITORS

The instant invention relates to a method for producing laminated capacitors wherein carriers are fastened in recesses of a drum, and the carriers on the drum are alternatingly conducted through two vacuum chambers. In one of these vacuum chambers metal layers are vacuum deposited or vaporized, and in the second vacuum chamber insulating material layers are applied. A method of this type is known from German Published, Non-Prosecuted Application DE-OS No. 28 47 620 and British Pat. No. 2,036,087. In these methods, metal layers are deposited by vaporization in a vacuum chamber, and in a second vacuum chamber glow-polymerisate layers are produced. The two chambers are separated by vacuum locks, in which ribs on the drum circumference between recesses of the drum form the vacuum locks on conjunction with outer end pieces. However, the prior art methods experience difficulty with respect to layer uniformity and equal thickness. It is accordingly an object of the invention to provide a method and apparatus for producing laminated capacitors, which overcomes the hereinafore-mentioned disadvantages of the heretofore-known methods and devices of this general type, and in which all metal layers are applied uniformly and with the same thickness.

With the foregoing and other objects in view there is provided, in accordance with the invention, a method for producing laminated capacitors, including a rotatable drum having a periphery and recesses formed therein, carriers disposed on the drum in the recesses defining a setting range on the periphery of the drum, a first vacuum chamber for metal layer deposition, a second vacuum chamber for insulating material layer deposition, means for supplying a vapor jet through a path in the first vacuum chamber and a shielding mask for shielding the carriers from the vapor jet, which comprises shielding off the carriers from the vapor jet with the shielding mask before vapor deposition, alternatingly conducting the carriers on the drum through the first and second vacuum chambers, removing the shielding mask from the vapor jet path after a given number of revolutions of the drum for the period during which the total setting range on the periphery of the drum rotates through the first zone, and reintroducing the shielding mask in the vapor jet path after the last metal layer has been deposited during the same rotation through the setting range.

This method has the advantage on one hand that no vapor deposition takes place during the loading of the drum and during the positioning of the carriers on the drum, and that on the other hand the evaporator can be heated to its optimal temperature before the vapor deposition. Furthermore, it is an advantage that the same part of the periphery of the drum is always in the vaporization zone during the withdrawal and during the insertion of the shielding mask. This achieves the result that irregular layers are formed only in this zone. These layers generated in this setting zone, can be excluded from further operations in the manufacture of capacitors, without difficulty.

In accordance with another mode of the invention, there is provided a method which comprises adjusting the setting range to the width of one recess. A small unutilized part of the drum circumference for means to control and move the shielding mask, is obtained without an excessive increase of the costs involved, if the whole setting range contains only one recess. In this case it is especially advantageous if, in accordance with a further mode of the invention, there are provided means disposed in the recesses for monitoring the quality of the layers, and a method which comprises measuring the quality of the layers or coating with the monitoring means after applying the second metal layer and before applying the last metal layer, and correcting deviations in the layers from given nominal values in the following layer. This permits a reliable control of the layer quality because only the first and the last metal layer can be non-uniformly generated, and thus not be suitable for inspection.

In accordance with the device of the invention, there is provided an apparatus for performing a method for producing laminated capacitors, comprising a rotatable drum having an axis and a periphery with recesses formed therein, ribs being disposed parallel to the axis on the drum between the recesses and having leading and trailing edges relative to the direction of rotation of the drum, carriers disposed on the drum in the recesses, a first vacuum chamber for metal layer deposition and a second vacuum chamber for insulating material layer deposition, the carriers on the drum being alternatingly rotatable through the chambers, sealing end pieces being disposed adjacent to the drum and forming vacuum locks with the ribs for separating the vacuum chambers from each other, means for supplying a vapor jet over a vapor deposition area through a path in the first vacuum chamber, a fixed mask for exactly limiting the vapor deposition area having an opening formed therein, the combined total width of at least one recess and two adjacent ribs being greater than the width or greatest dimension of the fixed mask in direction of rotation of the drum, a shielding mask for shielding the carriers from the vapor jet, the recesses and ribs determining a setting range for the shielding mask, control means for removing the shielding mask from the vapor jet path and reintroducing it into the vapor jet path after a final vaporization, the control means being operable to begin moving the shielding mask when the leading edge of a given rib passes the fixed mask opening and to stop moving, i.e. retracting and introducing, the shielding mask after a recess and the trailing edge of the next rib adjacent the given rib in direction of rotation of the drum has reached the fixed mask opening.

Because of this phase position of the motion of the shielding mask, on one hand the setting range is limited to one recess, and on the other hand the region is fully utilized, because there is no interference with the metallizing operations in adjacent recesses. The complexity of the control means is therefore kept relatively small, a fact which is especially important at high rotational velocities of the drum. Any conventional control device such as an electromagnetic actuator with a proximity or electric eye switch can be used for the control means.

In accordance with another feature of the invention, there is provided measuring means disposed in the recesses in the setting range for monitoring quality of at least one of the metal and/or insulating or di-electric layers.

In accordance with a further feature of the invention, there are provided means for measuring the layer thickness of at least one of the vapor deposited metal layers or coating areas and insulating or di-electric layers, and control means for comparing the measured thicknesses with given nominal values and automatically initiating a correction of the subsequently applied layers upon deviation from the given values.

In accordance with a concomitant feature of the invention, there is provided a test strip disposed in the recess in the setting range being carried along on the drum after deposition of each layer, and means disposed outside of the vapor deposition area, for measuring layer thickness with the test strip.

Other features which are considered as characteristic for the invention are set forth in the appended claims.

Although the invention is illustrated and described herein as embodied in method and apparatus for producing laminated capacitors, it is nevertheless not intended to be limited to the details shown, since various modifications and structural changes may be made therin without departing from the spirit of the invention and within the scope and range of equivalents of the claims.

The construction and method of operation of the invention, however, together with additional objects and advantages thereof will be best understood from the following description of specific embodiments when read in connection with the single FIGURE of the drawing which is fragmentary, diagrammatic elevational view of the device of the invention.

Referring now more particularly to the single FIGURE of the drawing, it is seen that a drum 1 is provided with recesses 2. Disposed in the recesses 2 are carriers 3, having the areas thereof that are not to be coated being covered by shields 4. The drum moves through two vacuum chambers I and II, which are separated from each other by vacuum locks that are formed on one hand, by ribs 5 of the drum 1, and on the other hand by end pieces or jaws 6 of the vacuum lock itself. A metal evaporator 7 is disposed in the vacuum chamber I, and the vapor deposition zone is limited by a shield 8 and a fixed mask 9.

A shielding mask is formed by the parts 10 and 11 which can be retracted in the direction B and C, away from the evaporating jet which rises in the direction of arrow D, and in turn can also be repositioned in the vapor jet.

The total range for the motion of the shielding parts 10 and 11 lies withing a defined recess 13. The motion of the shielding parts, i.e. the withdrawal of the parts from the vapor jet and the introduction of the shielding parts into the vapor jet, begins at a defined point in time. This takes place as soon as the first or leading edge 12 of the rib 5 which lies before the depression 13 in the rotational direction A of the drum has passed the mask opening 16 of the fixed mask 9, and has therefore passed the edge 17 of the mask opening 16 at all points thereof. The motion of the shielding parts is finished, before the last or trailing edge 14 of the rib 5 which lies after the recess 13 in the rotational direction A of drum 1, has reached the edge 18 of the mask opening 16 at any chosen point. In this manner, it is guaranteed that the thickness of the metal coatings on the carriers 3 in the adjacent depressions 2 is not influenced by the motion of the shielding parts 10 and 11 of the shielding mask.

In the recess 13 there are measuring means 15, which preferably measure the thickness of the vapor-deposited metal layers and insulation coatings. These measurements are performed after producing the second metal layer and before making the last metal layer. This makes certain that the first and last metal layer are not included in the measurements, since these become useless because of the removal and the introduction of the shielding mask.

The fixed mask 9 is disposed very close to the drum 1, to assure exact boundary limits of the evaporation zone. The shielding mask can be disposed behind the fixed mask. The velocity of the vapor jet is so great, that no measurable delay of the coating operation is caused by the spreading or propagation of the vapor jet using measurement methods which are technically available.

The measuring means 15 in the depression 13 preferably measures the layer thickness of the metal coatings. Control devices which are not shown regulate the evaporation rate according to these measurement results, such as by controlling the heating power in the evaporator. For the determination of the layer thickness of the insulating layers, reflectivity measurements may for example by used. These measurements are preferably made in the zone of the vacuum lock end pieces 6, because at the point in time when the drum has moved that far no coating takes place. The measurements can be performed independently of the position of the measuring means with respect to the vacuum locks 6, if a test strip is coated in the recess 13, and transported along after each coating. In this case, the measurements are made outside of the part of the test strip which is being coated.

There are claimed:

1. Method for producing laminated capacitors, including a rotatable drum having a periphery and recesses formed therein, ribs disposed on the drum between the recesses having leading and trailing edges relative to the direction of rotation of the drum, carriers disposed on the drum in the recesses, defining a setting range for laminations on the periphery of the drum equal to the width of a recess, a first vacuum chamber for metal layer deposition, a second vacuum chamber for insulating material layer deposition, a metal evaporator supplying a vapor jet through a path in the first vacuum chamber, a fixed mask spaced apart from the drum between the metal evaporator and the drum and having an opening formed therein defining first and second opening edges respectively disposed toward the leading and trailing edges of any given rib, in vicinity of the fixed mask during rotation of the drum, and a shielding mask spaced apart from the drum between the fixed mask and the metal evaporator for shielding the carriers from the vapor jet and allowing the vapor jet to reach the carriers in the setting range, which comprises shielding off the carriers from the vapor jet with the shielding mask before vapor deposition, alternatingly conducting the carriers on the drum through the first and second vacuum chambers for producing alternating metal and insulating layers on the carriers, rotating the drum for a given number of revolutions while the setting range on the periphery of the drum rotates through the first zone, subsequently initiating removal of the shielding mask from the vapor jet path when the leading edge of a given rib passes the second opening edge of the fixed mask, fully removing the shielding mask when the trailing edge of the next rib following the given rib in direction of rotation of the drum passes the first opening edge of the fixed mask, initiating reintroduction of the shielding mask in the vapor jet path after one complete revolution of the drum when the leading edge of the given rib again passes the opening in the fixed mask and closing the shielding mask when the trailing edge of the following rib passes the first opening edge of the fixed mask.

2. Method according to claim 1, including means disposed in the recesses for monitoring the quality of the layers, which comprises measuring the quality of the layers with the monitoring means after applying two metal layers and before reintroducing the shielding mask, and correcting deviations in the layers from given nominal values in the following layer.

3. Apparatus for performing a method for producing laminated capacitors according to claim 1, comprising a rotatable drum having an axis and a periphery with recesses formed therein, ribs being disposed parallel to said axis on said drum between said recesses and having leading and trailing edges relative to the direction of rotation of said drum, carriers disposed on said drum in said recesses, a first vacuum chamber for metal layer deposition and a second vacuum chamber for insulating material layer deposition, said carriers on said drum being alternatingly rotatable through said chambers, sealing end pieces being disposed adjacent to said drum and forming vacuum locks with said ribs for separating said vacuum chambers from each other, means for supplying a vapor jet over a vapor deposition area through a path in the first vacuum chamber, a fixed mask for limiting the vapor deposition area having an opening formed therein, the combined width of one recess and two adjacent ribs being greater than the width of said fixed mask in direction of rotation of said drum, a shielding mask spaced apart from said drum for shielding said carriers from the vapor jet, said recesses and ribs determining a setting range for laminations equal to the width of one recess, said shielding mask being removed during passage of said setting range, control means for removing said shielding mask from the vapor jet path and reintroducing it into the vapor jet path after a final vaporization, said control means being operable to begin moving said shielding mask when said leading edge of a given rib passes said fixed mask opening and to stop moving said shielding mask after a recess and said trailing edge of the next rib adjacent said given rib in direction of rotation of said drum has reached said fixed mask opening.

4. Apparatus according to claim 3, including measuring means disposed in said recesses in said setting range for monitoring quality of at least one of said metal and insulating layers.

5. Apparatus according to claim 4, including means for measuring the layer thickness of at least one of said vapor deposited layers and insulating layers, and control means for comparing the measured thicknesses with given nominal values and initiating a correction of the subsequently applied layers upon deviation from said given values.

6. Apparatus according to claim 3, 4 or 5, including a test strip disposed in said recess in said setting range being carried along on said drum after deposition of each layer, and means disposed outside of the vapor deposition area, for measuring layer thickness with said test strip.

* * * * *